United States Patent [19]

Hall

[11] Patent Number: 5,023,589
[45] Date of Patent: Jun. 11, 1991

[54] GOLD DIFFUSION THIN FILM RESISTORS AND PROCESS

[75] Inventor: Allen T. Hall, Forestdale, R.I.

[73] Assignee: Electro-Films, Inc., Warwick, R.I.

[21] Appl. No.: 404,590

[22] Filed: Sep. 8, 1989

[51] Int. Cl.$^5$ .......................................... H01C 1/012
[52] U.S. Cl. ................................... 338/308; 338/314; 427/102; 204/192.21
[58] Field of Search ............... 338/308, 309, 306, 307, 338/314; 29/620; 204/192.15, 192.19, 192.21, 192.25, 192.31; 427/101, 102, 103; 428/210

[56] References Cited

U.S. PATENT DOCUMENTS

| | | | |
|---|---|---|---|
| 4,164,607 | 8/1979 | Thiel et al. ...................... | 338/309 X |
| 4,204,935 | 5/1980 | Kleese et al. .................... | 338/308 X |
| 4,205,299 | 5/1980 | Kleese et al. .................... | 338/308 |
| 4,692,230 | 9/1987 | Nihei et al. ..................... | 204/192.31 |
| 4,725,480 | 2/1988 | Gurol ............................. | 428/210 |
| 4,803,457 | 2/1989 | Chapel, Jr. et al. ............. | 338/195 |

*Primary Examiner*—Bruce A. Reynolds
*Assistant Examiner*—Marvin M. Lateef
*Attorney, Agent, or Firm*—Weingarten, Schurgin, Gagnebin & Hayes

[57] ABSTRACT

A low-resistance nickel-chromium-based thin film resistor and method for forming same. A nickel-chromium alloy film is coated on at least one side with a layer of gold, the resulting gold-coated alloy film is heated at a temperature and for a time effective to cause diffusion of sufficient gold into the nickel-chromium film to lower its resistance to a desired value, and the gold layer is then removed, to leave a nickel-chromium-gold composite film resistor.

5 Claims, 3 Drawing Sheets

GOLD DIFFUSION THIN FILM RESISTORS AND PROCESS

FIELD OF THE INVENTION

The invention relates to electrical resistors, and more particularly, to thin film resistors having relatively low resistance.

BACKGROUND OF THE INVENTION

Film resistive elements are known, typically for use in hybrid and other microelectronic circuits. Such resistors are frequently made of Nichrome, a nickel-chromium alloy, and have resistivity typically in the range 50 to 200 ohms per square.

It is often desirable to have thin film resistors possessing significantly lower resistances, and that have characteristics of temperature coefficient of resistance, laser trimmability and resistance stability similar to Nichrome, but such resistors have heretofore not been available.

SUMMARY OF THE INVENTION

The present invention provides a nickel-chromium thin film resistor having resistivity significantly lower than thin film resistors of the prior art, but which substantially retains the temperature coefficient of resistance and drift of the nickel-chromium alloy on which it is based, while also providing a thin metal layer which is readily trimmable.

The low resistance thin film resistor of this invention includes a film of nickel-chromium alloy, and contains gold diffused in the film at a level sufficient to reduce the resistivity of the film from its initial value to a desired lower value, between the resistivity of corresponding films of gold and nickel chromium alone.

The thin film resistor of the invention is prepared by coating at least one side of a nickel-chromium alloy film with gold, heating the resulting gold-coated alloy film at a temperature and for a time sufficient to cause diffusion of at least some of the gold into the alloy film, and then removing from the gold-coated alloy film that gold which has not diffused into the film.

Among the advantages of the low-ohm thin film resistors of this invention are the following. It is possible to make low-ohm resistors with tight tolerances easily by laser trimming relatively larger elements. It is possible to use the gold-diffusion process to salvage nickel-chromium coated plates having excessively high resistivities, by causing gold to diffuse into the surface, lowering the resistivity. Electrical parts made from such thin films should exhibit excellent long term stability due to the gold limiting the oxidation of the nickel-chromium layer by acting as a passivation layer. The power dissipation from films of the invention should be superior to the power dissipation observed in prior art nickel-chromium films. It is possible to employ the gold-containing nickel-chromium thin layers to produce electrical networks having both high and low value resistors on the same substrate, by masking the resistors that are to be of lower values, and allowing gold diffusion to reduce the resistivity of those portions of the starting sheet which are to be low value resistors.

DESCRIPTION OF THE DRAWING

The invention will be better understood from a consideration of the following detailed description taken in conjunction with the drawing, in which.

DETAILED DESCRIPTION OF THE INVENTION

Figure 1:
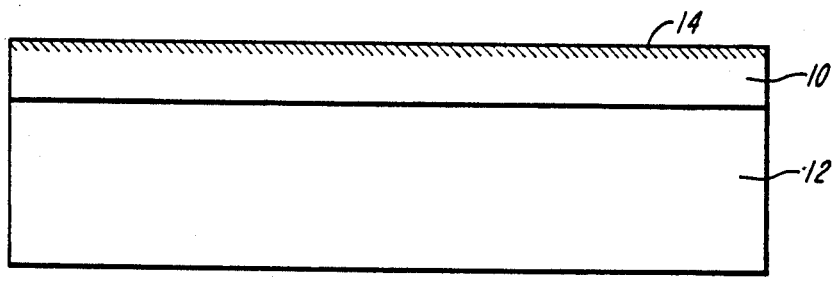
FIG. 1 is an enlarged cross-sectional view of the thin film resistor of the invention, mounted on a substrate.

As shown in FIG. 1, the thin film resistor of the invention is a nickel-chromium alloy film 10 provided on a substrate 12. The surface of alloy film 10 contains a small amount of diffused gold 14. Substrate material 12 is a nonconductive supporting material, such as alumina or aluminum nitride. The thin film resistor has a thickness typically in the range 100 to 500 Å and a preferred alloy contains 18–25 atomic weight percent of nickel, 65–75 atomic weight percent of chromium, and 7–12 atomic weight percent of aluminium. The amount of gold diffused in the surface of thin film 10 is that amount which is sufficient to produce a desired resistivity in the range 1 to 10 ohm-centimeters, preferably in the range 3 to 7 ohm-centimeters.

The temperature coefficient of resistance (TCR) and drift of the gold-diffused thin film 10 is substantially the same as that of the thin alloy film without gold. Generally speaking, the temperature coefficient of resistance of a given nickel-chromium thin film should be within 0 to 50% of the temperature coefficient of resistance of the same film containing diffused gold.

Figure 2:
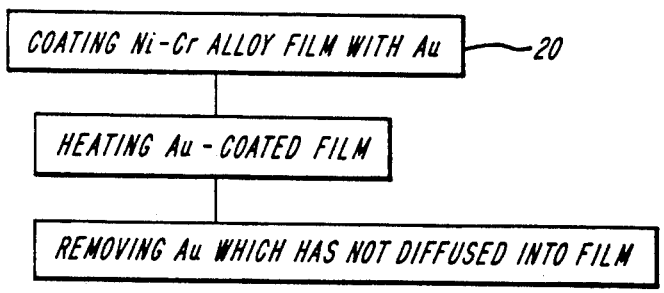
FIG. 2 is a block diagram showing the process for producing the thin film resistor.

As shown in FIG. 2, the thin film resistor of the invention is made by coating a nickel-chromium alloy film with a layer of gold (step 20), heating the gold-coated film to cause some of the gold to diffuse into the nickel-chromium alloy layer (step 22), and finally, removing the gold which has not diffused into the nickel-chromium alloy film (step 24).

The nickel-chromium film is formed on a substrate by any film-depositing technique, one example being sputtering. The thickness of this film is typically in the range of 100 to 500 Å. The resistivity of the nickel-chromium film is typically in the range 50 to 200 ohm-centimeters.

Following formation of the nickel-chromium film, a layer of gold is laid down by means of any applicable technique, such as sputtering. The thickness of this gold layer is not critical but is typically in the range of 100–500 Å, preferably about 300 Å.

The film and its covering layer of gold are next heated in the range 300 to 500° C., typically 340° C., for a time of 10 minutes to 2 hours, typically about one hour, to cause gold to diffuse into the film. After the system has been allowed to cool, the gold which has not diffused into the surface of the film is removed, typically by an etching process as known to the art. For example, a generic cyanide gold etch or potassium iodide and iodine gold etch is employed.

The nickel-chromium layer, now containing a small amount of diffused gold, has a resistivity which is a function of the film thickness and the amount of gold diffused in the surface of the film. The latter is in turn dependent upon the time and temperature employed in the heating step discussed above. It has been found that even when the nickel-chromium layer is saturated with diffused gold, its resistivity is still in the desired range.

EXPERIMENT 1

An aluminum oxide plate 3¾"×4 ¼" was coated with nickel-chromium alloy to a thickness of about 150 Å, and the short ends of the rectangular plate were coated with gold at a thickness of about 100–150 microns, to serve as electrical contacts. This plate showed a resistance of approximately 180 ohms per square. Next, the nickel-chromium film between the gold plated ends was coated with a layer of gold by sputtering and the plate was then cut in half in a direction such that both halves retained gold-plated contact ends. One of the half plates was etched with an above mentioned etchant to remove the gold layer covering the nickel-chromium alloy film to leave bare alloy exposed, and the second half plate was left untreated. Both plate halves were then heated at a temperature of 340° C. for one hour. Following this treatment, the half plate bearing the gold-plated alloy film was etched to remove the layer of gold. It was found that not all of the gold could be removed by this etching process. The resistance and the temperature coefficient of resistance were measured for each half plate, and it was found that each half plate showed a temperature coefficient of resistance of approximately −28 ppm, but the half plate which had been heated with gold covering the nickel-chromium alloy layer now showed a sheet resistance of approximately 7 ohms per square. This demonstrates that diffusion of a small amount of gold into a nickel-chromium thin film layer reduces the resistance of the layer substantially but does not appreciably change the temperature coefficient of resistance of the alloy film.

EXPERIMENT 2

Several additional trials were run as in experiment 1 above, using nickel-chromium layers having different initial sheet resistances. The results are shown in the table below:

the sheet resistance of the as-deposited nickel-chromium film showed a correlation with a positive slope but a correlation coefficient of only 0.74, indicating that the data exhibits a moderate degree of scatter.

EXPERIMENT 3

The sheet of run number 1 (Table 1) was employed as the starting material for the manufacture of 100×100 mil circuits. This nickel-chromium-coated plate had a sheet resistance of approximately 180 ohms prior to gold diffusion. The film was coated with gold to a thickness of approximately 300 Å and then coated with a photoresist. The resist was exposed in a first pattern corresponding to areas intended to be conducting areas in the final circuit, then the resist was developed to expose the areas intended to be conductors. The exposed conductor layers were then plated with gold to a thickness of at least 100 microns and the remaining photo resist was stripped. Next, the plate was recoated with photoresist and exposed in a second pattern corresponding to areas intended to be resistors in the ultimate circuit. The photoresist was then developed, exposing the resistor pattern, and the sputtered gold layer covering the nickel-chromium alloy was etched away. Next, the nickel-chromium alloy layer was etched back and the photoresist was stripped away. The plate was baked at approximately 340° for one hour to diffuse gold into the nickel-chromium alloy layer, the residual gold was etched away, and the plate was reheated at 340° C. to stabilize its resistance. Finally, the plate resistance and the temperature coefficient of resistance were measured.

Figure 4:
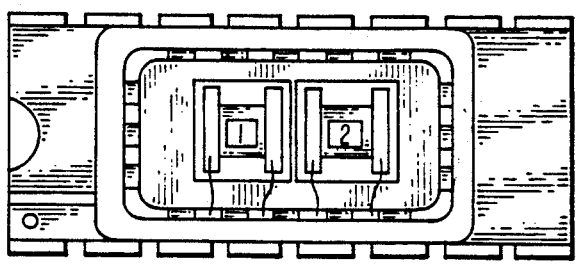
FIG. 4 is a cutaway view of a 16 lead hermetic package configuration.

Every other circuit was laser trimmed up to a 1 kΩ nominal value. The temperature coefficient of the plate was approximately −30 ppm/°C. A map of temperature coefficient of resistance was produced to show the temperature coefficient of resistance of the gold diffused layer at many different points over the surface of the plate. Following the determination of the distribution of temperature coefficient of resistance readings, the plate was coated with "stop-off" and cut by laser into single resistor chips of a 100×100 mil size. Thirty-two of these chips were selected and each placed in a 16 lead hermetic package as shown in FIG. 4. Two of these units were heated for 48 hours at a temperature of about 200° C. to test their stability.

The change in resistance as a function of temperature for a nominal 1 kΩ resistor prepared as indicated above

TABLE 1

| | Run Number | | | | | | | | |
|---|---|---|---|---|---|---|---|---|---|
| | 1 | 2 | 3 | 4 | 5 | 6 | 7 | 8 | 9 |
| Sheet resistance,[1] NiCr layer | 183 | 56 | 91 | 266 | 234 | 125 | 230 | 172 | 209 |
| Sheet resistance,[1] after Au diffusion | 7.0 | 9.0 | 10.0 | 6.4 | 4.2 | 8.6 | 6.1 | 5.3 | 9.3 |
| TCR[2] after Au diffusion | −16 | −70 | −109 | −28 | +95 | −95 | +39 | −26 | −70 |

[1] sheet resistance given in ohms/sq.
[2] temperature coefficient of resistance given in ppm/°C.

Figure 3:
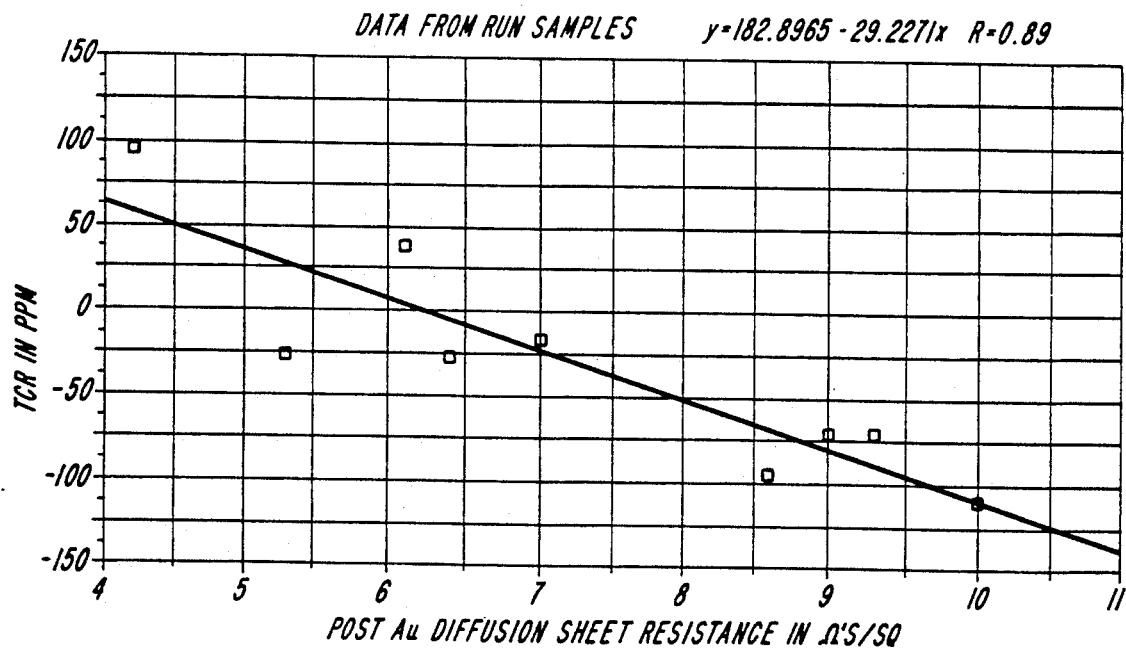
FIG. 3 is a graph of temperature coefficient of resistance versus sheet resistance for a gold-diffused nickel-chromium alloy film.
Figure 5:
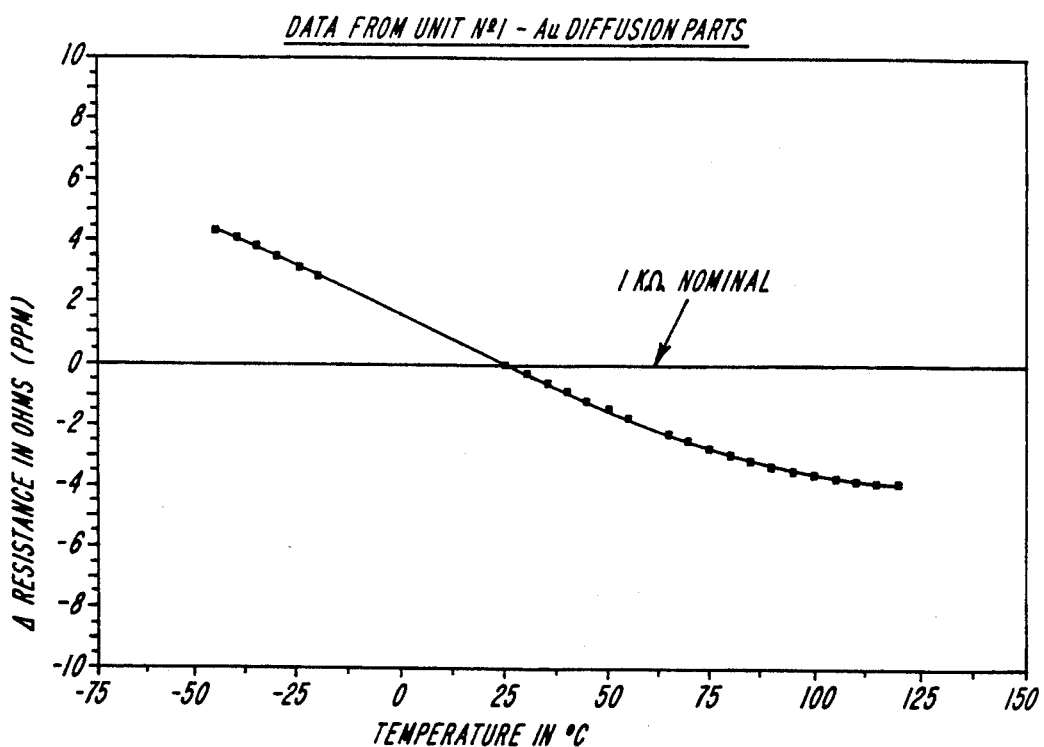
FIG. 5 is a graph of the resistance of a nominal 1 kΩ resistor of the invention as a function of temperature.
Figure 6:
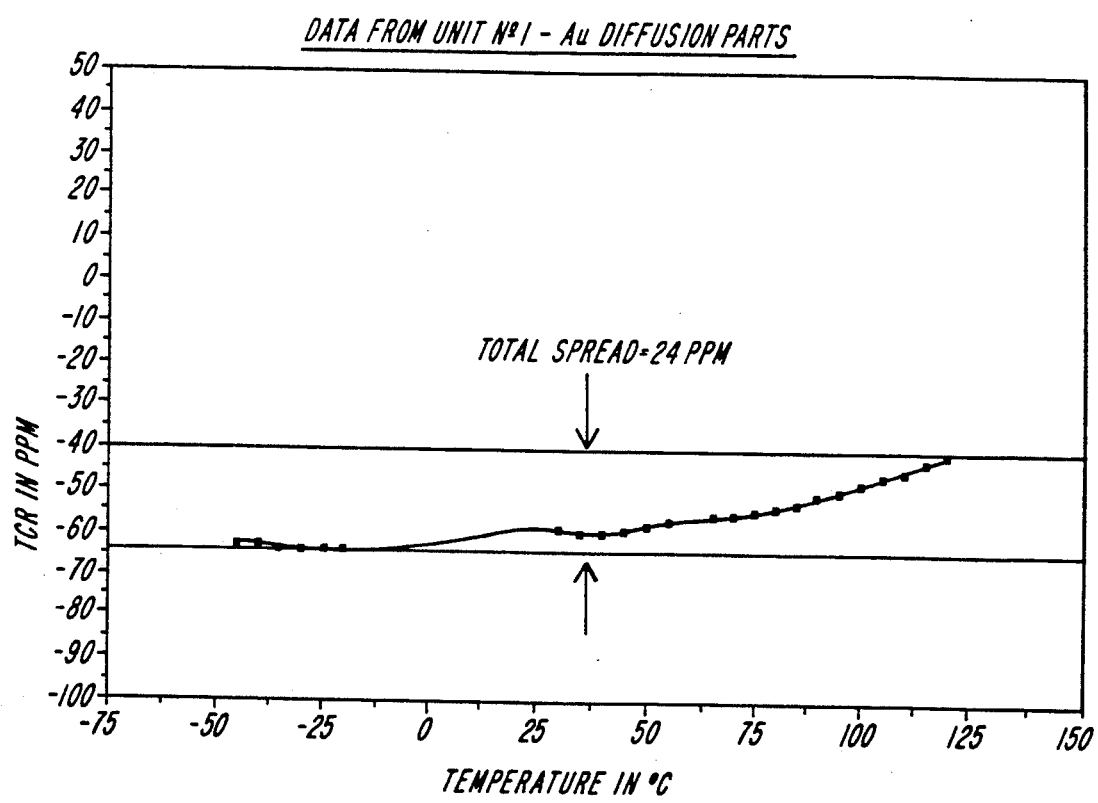
FIG. 6 is a graph of the temperature coefficient of resistance as a function of temperature for a resistor of the invention.

A review of the results presented in Table 1 indicated that there is a correlation between the sheet resistance and the temperature coefficient of resistance for the nickel-chromium alloy films in which gold has been diffused. This is demonstrated graphically in FIG. 3, which shows a straight line correlation between the temperature coefficient of resistance and the sheet resistance, the correlation coefficient being 0.89. A similar plot of the temperature coefficient of resistance versus is shown in FIG. 5. The change in temperature coefficient of resistance as a function of temperature is correspondingly shown in FIG. 6.

Other embodiments of the invention will be apparent to those skilled in the art from a consideration of this specification or practice of the invention disclosed herein. It is intended therefore that the specification and examples be considered as exemplary only, with the true scope and spirit of the invention being indicated by the following claims.

What is claimed is:

1. A thin film resistor, comprising:
   a film of nickel-chromium alloy; and
   gold diffused in at least one surface of said alloy film in an amount sufficient to cause the resistivity of the resulting composite to be between the resistivity of gold and the resistivity of said nickel-chromium alloy the diffused gold having a concentration gradient which is of highest concentration at or near said at least one surface.

2. The thin film resistor of claim 1 wherein said nickel-chromium alloy film contains 18 to 25% by weight nickel, 65 to 75% by weight chromium, and 7 to 12% by weight aluminum.

3. The thin film resistor of claim 1 wherein said nickel-chromium film has a thickness of 100 to 500 Å.

4. The thin film resistor of claim 1 wherein the resistivity of said resistor is between 1 and 10 ohm-cm.

5. The thin film resistor of claim 1 wherein the temperature coefficient of resistance of said resistor is substantially the same as the temperature coefficient of resistance of the nickel-chromium alloy film.

* * * * *